United States Patent [19]

Readio et al.

[11] 4,158,592

[45] Jun. 19, 1979

[54] DISSOLUTION OF METALS UTILIZING A $H_2O_2$-SULFURIC ACID SOLUTION CATALYZED WITH KETONE COMPOUNDS

[75] Inventors: Philip D. Readio, Sparta; John L. H. Allan, Glen Rock, both of N.J.

[73] Assignee: Dart Industries Inc., Los Angeles, Calif.

[21] Appl. No.: 849,573

[22] Filed: Nov. 8, 1977

[51] Int. Cl.² .......................... C09K 13/06; C23F 1/00
[52] U.S. Cl. ..................................... 156/666; 156/664; 252/186; 252/79.4; 423/272
[58] Field of Search .............. 156/664, 666; 252/79.2, 252/79.4, 180, 186, 100, 95, 145, 175; 423/27, 41, 272, 584, 508, 510; 75/101 R, 115, 117

[56] References Cited

U.S. PATENT DOCUMENTS

| | | | |
|---|---|---|---|
| 3,480,557 | 11/1969 | Shiraeff | 423/272 |
| 3,597,290 | 8/1971 | Naito et al. | 156/666 |
| 3,801,512 | 4/1974 | Solenberger | 252/79.4 |
| 3,809,588 | 5/1974 | Zeblisky | 156/666 |
| 3,869,401 | 3/1975 | Ernst | 423/272 |
| 4,070,442 | 1/1978 | Watts | 423/272 |
| 4,086,176 | 4/1978 | Ericson et al. | 423/272 |

FOREIGN PATENT DOCUMENTS 7239460  9/1968  Japan ...................................... 252/79.4

*Primary Examiner*—Jerome W. Massie
*Attorney, Agent, or Firm*—Margareta LeMaire; Bryant W. Brennan

[57] ABSTRACT

Improved metal dissolution rates are obtained when using a solution containing sulfuric acid, hydrogen peroxide and an effective amount of a ketone soluble in the solution.

23 Claims, No Drawings

DISSOLUTION OF METALS UTILIZING A H₂O₂-SULFURIC ACID SOLUTION CATALYZED WITH KETONE COMPOUNDS

The present invention relates to the dissolution of metals in an aqueous bath containing sulfuric acid and hydrogen peroxide, and in particular to a novel bath composition capable of effecting the dissolution at high rates. In one specific aspect the invention is concerned with etching of copper in the production of printed circuit boards.

BACKGROUND OF THE INVENTION

As is well known in the art, in the manufacture of printed electronic circuits a laminate of copper and etch resistant material, usually plastic, is used. A common method of obtaining the circuits is to mask the desired pattern on the copper surface of the laminate with a protective resist material, which is impervious to the action of an etch solution. In a subsequent etching step, the unprotected areas of the copper are etched away, while the masked areas remain intact and provide the desired circuiting supported by the plastic. The resist material can be a plastic material, an ink or a solder.

In the last few years, the industry has more and more turned to hydrogen peroxide-sulfuric acid systems for etching the electronic circuit boards, due to the low cost of the etching solutions and to the relative ease with which copper values can be recovered from the spent etch solutions.

However, there are many problems connected with the use of hydrogen peroxide as an ingredient in the etchants. It is a well known fact that the stability of hydrogen peroxide in a sulfuric acid-hydrogen peroxide solution is detrimentally affected by the presence of heavy metal ions such as copper ions. Thus, as etching proceeds and copper ion content of the etchant thereby increases, the etch rate will experience a serious drop-off due to the decomposition of the hydrogen peroxide in the etch bath, which will soon be exhausted. In order to improve the capacity of these etchants, various stabilizers have been suggested and used with some success for abatement of the hydrogen peroxide decomposition due to the presence of copper ions.

Although considerable retardation of the metal ion induced hydrogen peroxide decomposition can be achieved by the addition of a suitable stabilizer, the etch rates of the stabilized hydrogen peroxide-sulfuric acid etchants have, generally, been quite low and in need of improvement especially at high copper ion concentrations. It has therefore, been suggested in the prior art to add a catalyst or promoter to improve the etch rate. Specific examples of such catalyst are the metal ions disclosed in the U.S. Pat. No. 3,597,290, such as silver, mercury, palladium, gold and platinum ions, which all have a lower oxidation potential than that of copper. Other examples include those of U.S. Pat. No. 3,293,093, i.e. phenacetin, sulfathiazole and silver ion, or the various combinations of any of the above three components with dibasic acids, as disclosed in U.S. Pat. No. 3,341,384, or with the phenyl ureas or benzoic acids of U.S. Pat. No. 3,407,141, or with the urea and thiourea compounds of U.S. Pat. No. 3,668,131.

Another problem often encountered using hydrogen peroxide-sulfuric acid etchants is that etching rates are adversely effected by the presence of even small amounts of chloride or bromide ions, and usually ordinary tap water cannot be used in preparing the etching solution. It is therefore, required that these ions be removed either by deionization of the water or by precipitation of the contaminating ions, e.g. with silver ions added in the form of a soluble silver salt.

Although silver ions thus appear to provide a universal solution to the above-discussed problem of low etch rates as well as that caused by the presence of free chloride and bromide ion content, there are still some disadvantages had with the use of silver ions in preparing hydrogen peroxide-sulfuric acid etch solutions. One of these is the high cost of silver. Another is that silver ions still do not promote the rate of etching as much as would be desired. Still another problem sometimes encountered in etching operations for the manufacture of printed circuit boards is the tendency of a formation of scaly solids, when employing a metal ion such as silver as a catalyst in the acidifed hydrogen peroxide etchant. These solids accumulate around the edges of the boards between or adjacent to the areas coated with the resist. When solder resist techniques are employed, the solder also has a tendency of becoming discolored. The aforementioned deposits and discolorations are undesirable in that they may interfere with the electrical properties of the formed circuit, and if severe enough, can cause short circuiting.

An object of the present invention is therefore to provide a novel, highly efficient aqueous composition for the dissolution of metals without any attendant scale formation or resist discoloration.

Another object is to provide an improved method for clean dissolution of metals, e.g. copper or alloys of copper, at high rates.

Other objects of the invention will become readily apparent from the detailed description set forth hereinafter.

THE INVENTION

In accordance with the present invention there is provided a composition which comprises an aqueous solution of from about 0.2 to about 4.5 gram moles per liter of sulfuric acid, from about 0.25 to about 8 gram moles per liter of hydrogen peroxide and added thereto an effective amount of a ketone soluble in the solution.

Ketones useful in this invention include mono and diketo substituted paraffins, isoparaffins and cycloparaffins. Specific examples of ketones useful in the invention include acetone, methyl ethyl ketone, diethyl ketone, methyl propyl ketone, diisopropyl ketone, methyl isobutyl ketone, diisobutyl ketone, etc; 2,3-butanedione, 2,3-pentanedione, 2,4-pentanedione, 2,5-hexanedione etc; cyclopentanone, cyclohexanone, etc.

The ketones are added in effective quantities, which typically amounts to at least about 0.01 gram moles per liter of solution and preferably between about 0.1 and about 0.5 gram moles per liter although higher concentrations may also be used. There is however, no particular added advantage in using such excess quantities.

The sulfuric acid concentration of the solution should be maintained between about 0.2 to about 4.5 gram moles per liter and preferably between about 0.3 and about 4 gram moles per liter. The hydrogen peroxide concentration of the solution should broadly be in the range of from about 0.25 to about 8 gram moles per liter and preferably limited to 1 to about 4 gram moles per liter.

Water is used to make up the remaining portion of the solution, which for best results should contain no more than about 2 ppm of free chloride or bromide ions. A conventional water deionization technique or precipitation of the contaminating ions, e.g. with a soluble silver salt, is therefore recommended to reduce the content of these deleterious ions.

The solutions may also contain other various ingredients such as any of the well known stabilizers used for counteracting heavy metal ion-induced degradation of hydrogen peroxide. Examples of suitable stabilizers include those disclosed in U.S. Pat. No. 3,537,895; U.S. Pat. No. 3,597,290; U.S. Pat. No. 3,649,194; U.S. Pat. No. 3,801,512 and U.S. Pat. No. 3,945,865. The aforementioned patents are incorporated in this specification by reference. Of course, any of various other compounds having a stabilizing effect on acidified hydrogen-peroxide metal treating solutions can be used with equal advantage.

Also, any of the additives known to prevent undercutting, i.e. side or lateral etching, can also be added, if desired. Examples of such compounds are the nitrogen compounds disclosed in U.S. Pat. Nos. 3,597,290 and 3,773,577, both incorporated in this disclosure by reference. However, in the present invention, the use of such additives is not necessary, because of the rapid etch rates obtained due to inclusion of the ketone promoters in the etching compositions.

The solutions are particularly useful in the chemical milling and etching of copper and alloys of copper, but other metals and alloys may also be dissolved with the solutions of this invention, e.g. iron, nickel, zinc and steel.

When using the solutions to dissolve a metal, conventional operating conditions for the particular metal are employed. Thus, in the etching of copper usually temperatures between about 105° to about 140° F. should be maintained and preferably the operating temperature should be between about 120° and about 135° F.

The solutions are eminently suited as etchants using either immersion or spray etching techniques. The etch rates obtained with the compositions of the invention are fast, e.g. etch times in the order of about 1 to 1.5 minutes are typical when etching copper laminates containing 1 oz. copper per square foot. Because of these unusually high etch rates the compositions are especially attractive as etchants in the manufacture of printed circuit boards, where it is required that a relatively large number of work pieces be processed per unit time for economical reasons as well as for minimizing detrimental lateral etching or undercutting of the edges under the resist material. Another important advantage of the invention is that clean etchings are achieved. Thus, no special treatment is required of the workpieces treated by the solution of this invention for the removal of solid deposits which otherwise would interfere with the function or appearance of said work piece. Still another advantage is that the etch rates of the solutions are relatively unaffected by high copper loadings.

The following examples are provided as illustrations of the invention.

EXAMPLES 1-8

In this set of comparative experiments copper laminates (2"×2") having a coating of one ounce copper per square foot were immersion etched in stirred baths maintained at 129° F. Each of the baths (800 ml) contained 15 volume percent 66° Baume sulfuric acid (2.7 gram moles/liter), 15 volume percent of 50 wt % hydrogen peroxide (2.6 gram moles/liter) and 70 volume percent distilled water. The solutions were stabilized with 2.5 grams/liter sodium phenolsulfonate. Without any catalyst present (Example 1) the time required to completely remove the copper from a laminate was 190-200 seconds. In tests using the same solutions but prepared with deionized water, etch times of 270 seconds were observed.

The etch solutions of Example 2-8 had the compositions of that of Example 1, except that they also contained 20 ml/1 of the ketone promoters indicated in Table 1. The result of the etching tests showed that all of the additives had a dramatic effect in improving the etch rates.

TABLE I

| Example No. | Additive | Etch Time, sec. |
|---|---|---|
| 1 | — | 190-200 (279)[1] |
| 2 | Acetone | 80 |
| 3 | Methyl ethyl ketone | 80 |
| 4 | Cyclohexanone[2] | 140 |
| 5 | 2,3-Butanedione | 60 |
| 6 | 4-Methyl-2-pentanone | 60 |
| 7 | Diisobutyl ketone | 130 |
| 8 | 2,4-Pentanedione[1] | 80 |

[1] Solution prepared with deionized water.
[2] Not completely soluble.

It should be noted that consistently superior results are obtained with the solutions of this invention in large scale operations e.g. by spray etching techniques. Specifically, the increase in etch rate as compared to that of a control solution is much more pronounced and also the actual etch times are substantially lower typically in the order of ⅓ to ⅔ of the values obtained using the small scale immersion technique described above.

It is obvious to those skilled in the art that many variations and modifications can be made to the specific embodiments discussed above. All such departures from the foregoing specification are considered within the scope of this invention as defined by this specification and the appended claims.

What is claimed is:

1. A method of metal dissolution which comprises contacting a metal with an aqueous solution containing from about 0.2 to about 4.5 gram moles per liter of sulfuric acid, from about 0.25 to about 8 gram moles per liter of hydrogen peroxide and an effective amount of a ketone additive soluble in the solution, which additive is selected from the group consisting of:
   (a) unsubstituted or substituted monoalkanones selected from acetone, methyl ethyl ketone, diethyl ketone, methyl propyl ketone, diisopropyl ketone, methyl isobutyl ketone and diisobutyl ketone;
   (b) cyclic monoalkanones selected from cyclopentanone and cyclohexanone, and
   (c) 2,3-butanedione.

2. The method of claim 1, wherein the ketone additive is provided at a concentration of at least about 0.01 gram moles per liter.

3. The method of claim 1, wherein the ketone additive is provided at a concentration in the range from about 0.1 to about 0.5 gram moles per liter.

4. The method of claim 1, wherein the aqueous solution contains sodium phenolsulfonate as a stabilizer to reduce the degrading effect of heavy metal ions on hydrogen peroxide.

5. The method of claim 1, wherein the hydrogen peroxide concentration is maintained between about 1 and about 4 gram moles per liter.

6. The method of claim 1, wherein the sulfuric acid concentration is maintained between about 0.3 and about 4 gram moles per liter.

7. The method of claim 1, wherein the metal is copper or an alloy of copper.

8. The method of claim 1, wherein the ketone is acetone.

9. The method of claim 1, wherein the ketone is methyl ethyl ketone.

10. The method of claim 1, wherein the ketone is 2,3-butanedione.

11. The method of claim 1, wherein the ketone is 4-methyl-2-pentanone.

12. The method of claim 1, wherein the ketone is diisobutyl ketone.

13. A composition for metal dissolution comprising an aqueous solution of from about 0.2 to about 4.5 gram moles per liter of sulfuric acid, from about 0.25 to about 8 gram moles per liter of hydrogen peroxide and an effective amount of a ketone additive soluble in the solution, which additive is selected from the group consisting of:
   (a) unsubstituted or substituted monoalkanones selected from acetone, methyl ethyl ketone, diethyl ketone, methyl propyl ketone, diisopropyl ketone, methyl isobutyl ketone and diisobutyl ketone;
   (b) cyclic monoalkanones selected from cyclopentanone and cyclohexanone, and
   (c) 2,3-butanedione.

14. The composition of claim 13, wherein the ketone additive is provided at a concentration of at least about 0.01 gram moles per liter.

15. The composition of claim 13, wherein the additive is provided at a concentration in the range from about 0.1 to about 0.5 gram moles per liter.

16. The composition of claim 13, additionally containing sodium phenolsulfonate as a stabilizer for reducing the degrading effect of heavy metal ions on hydrogen peroxide.

17. The composition of claim 13, wherein the hydrogen peroxide concentration is maintained between about 1 and about 4 gram moles per liter.

18. The composition of claim 13, wherein the sulfuric acid concentration is maintained between about 0.3 and about 4 gram moles per liter.

19. The composition of claim 13, wherein the ketone is acetone.

20. The composition of claim 13, wherein the ketone is methyl ethyl ketone.

21. The composition of claim 13, wherein the ketone is 2,3-butanedione.

22. The composition of claim 13, wherein the ketone is 4-methyl-2-pentanone.

23. The composition of claim 13, wherein the ketone is diisobutyl ketone.

* * * * *

UNITED STATES PATENT AND TRADEMARK OFFICE
CERTIFICATE OF CORRECTION

PATENT NO. : 4,158,592
DATED : June 19, 1979
INVENTOR(S) : Philip David Readio and John Leslie Hugh Allan It is certified that error appears in the above—identified patent and that said Letters Patent are hereby corrected as shown below:

Table 1, Example No. 1 "190-200(279)[1]" should read

-- 190-200(270)[1] -- .

Signed and Sealed this

Twenty-fifth Day of September 1979

[SEAL]

Attest:

Attesting Officer

LUTRELLE F. PARKER
*Acting Commissioner of Patents and Trademarks*